United States Patent [19]

McDonald et al.

[11] Patent Number: 5,534,849
[45] Date of Patent: Jul. 9, 1996

[54] TIME MULTIPLEXED, FALSE ALARM RESISTANT MAGNETICALLY ACTUATED SECURITY SYSTEM

[75] Inventors: Kevin B. McDonald, Portland; Stephen W. Pierce, Tigard; Michael Benowitz, Lake Oswego; David S. Terrett, Beaverton, all of Oreg.

[73] Assignee: Sentrol, Inc., Tualatin, Oreg.

[21] Appl. No.: 351,566

[22] Filed: Dec. 6, 1994

Related U.S. Application Data

[63] Continuation of Ser. No. 105,588, Aug. 11, 1993, abandoned.

[51] Int. Cl.[6] .................................................. G08B 13/08
[52] U.S. Cl. ........................ 340/517; 340/511; 340/547; 340/551
[58] Field of Search ........................ 340/517, 518, 340/547, 550, 573, 541, 551, 511, 545, 522

[56] References Cited

U.S. PATENT DOCUMENTS

| | | | |
|---|---|---|---|
| 4,210,889 | 7/1980 | Holce | 335/207 |
| 4,271,405 | 6/1981 | Kitterman | 340/541 |
| 4,287,512 | 9/1981 | Combs | 340/547 |
| 4,349,814 | 9/1982 | Akehurst | 340/679 |
| 4,427,975 | 1/1984 | Kinzie | 340/547 |
| 4,433,355 | 2/1984 | Chew et al. | 361/172 |
| 4,773,031 | 9/1988 | Tobin | 364/703 |
| 4,782,330 | 11/1988 | Tindall et al. | 340/541 |
| 4,806,910 | 2/1989 | Sälzer | 340/547 |
| 4,812,674 | 3/1989 | Sue et al. | 307/116 |
| 4,990,888 | 2/1991 | Vogt et al. | 340/518 |
| 5,254,973 | 10/1993 | Gilmore, II | 340/547 |

*Primary Examiner*—Brent A. Swarthout
*Assistant Examiner*—Daniel J. Wu
*Attorney, Agent, or Firm*—Stoel Rives

[57] ABSTRACT

A magnetically actuated switch system (10) has reduced sensitivity to false alarms and reduced power consumption and resistance to physical and magnetic tampering. The system includes a signal processing circuit controlled by a microprocessor (16) that selectively enables magnetic sensors (12, 38), and compares the corresponding sensor outputs (76) to automatically calibrated level and predetermined timing characteristics.

16 Claims, 8 Drawing Sheets

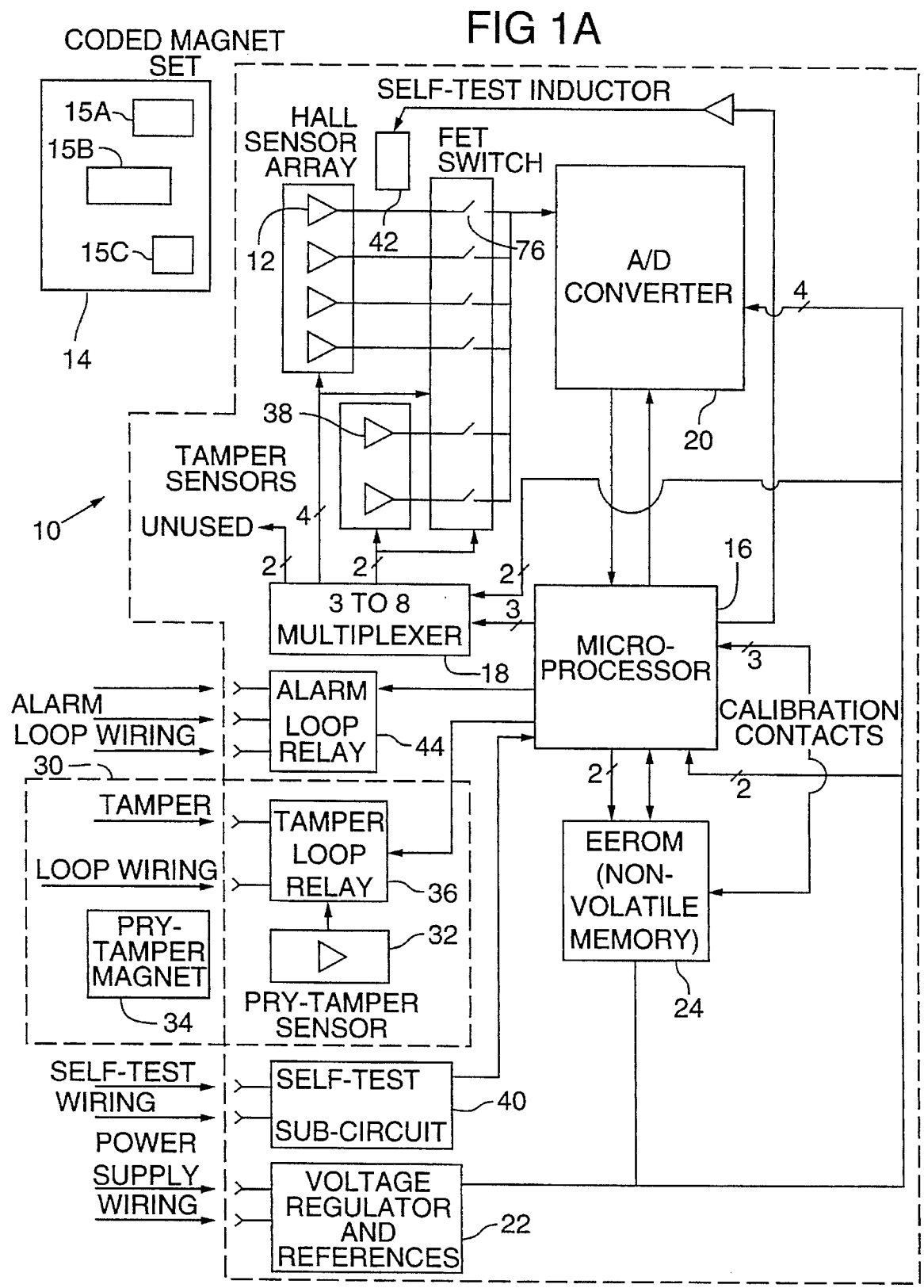

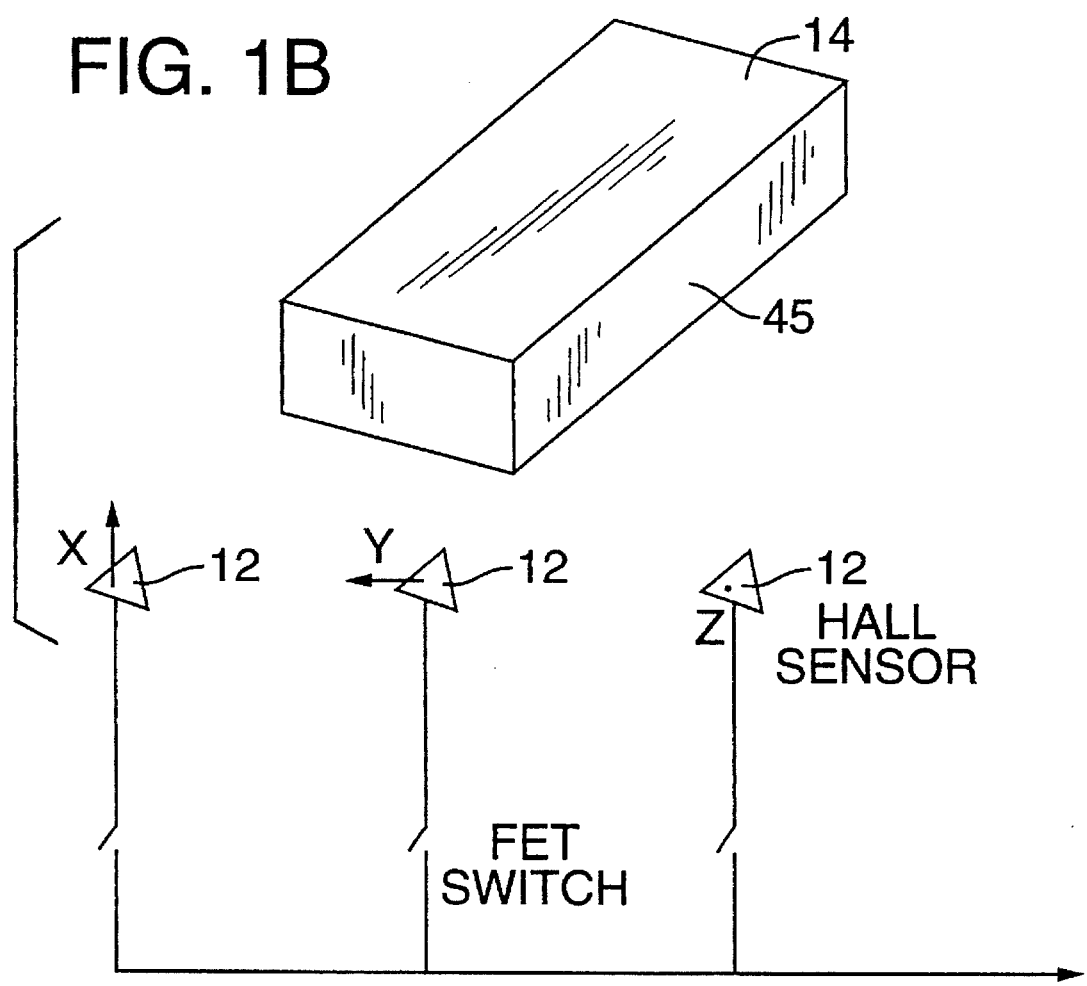

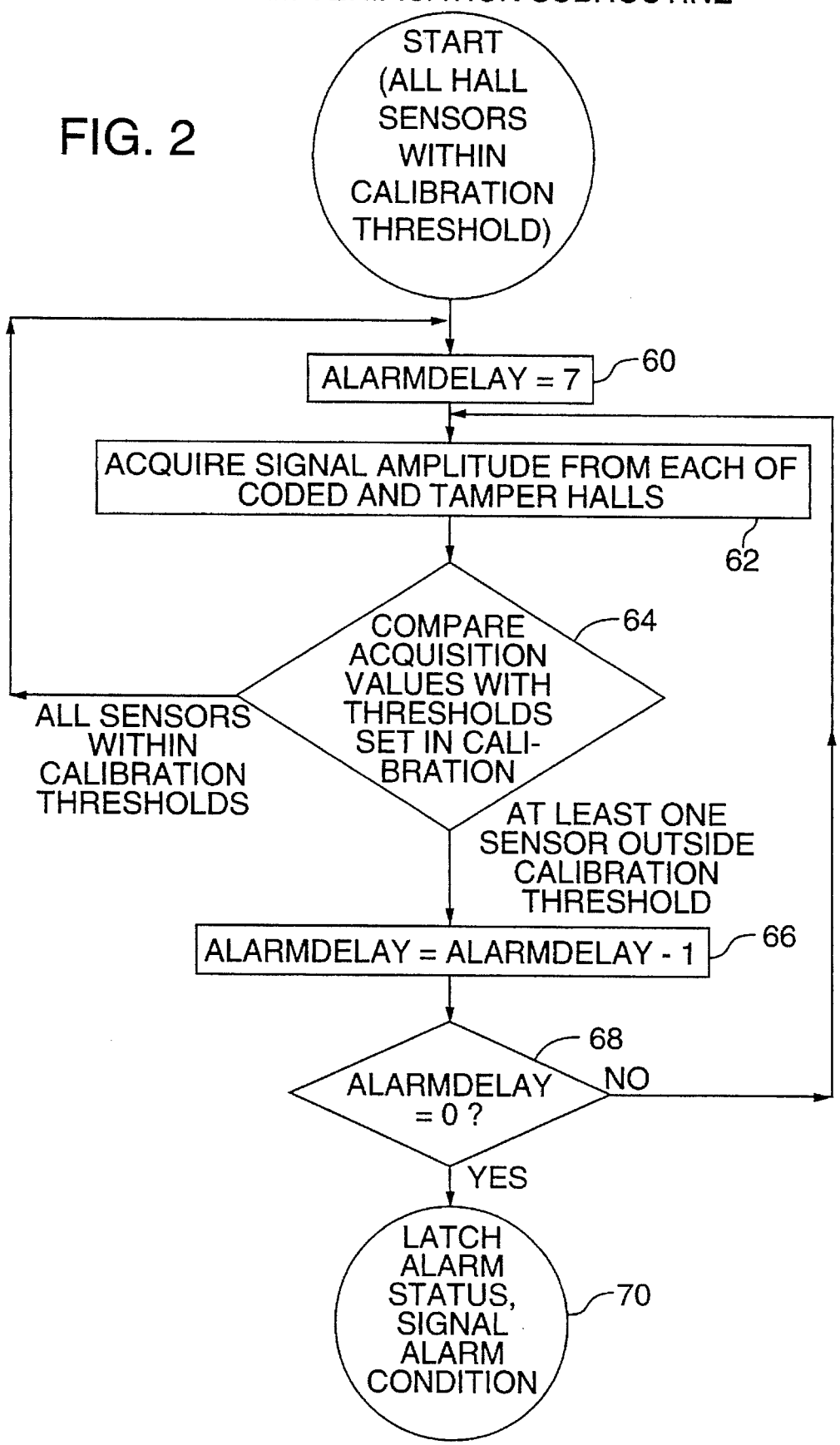

FIG. 3B

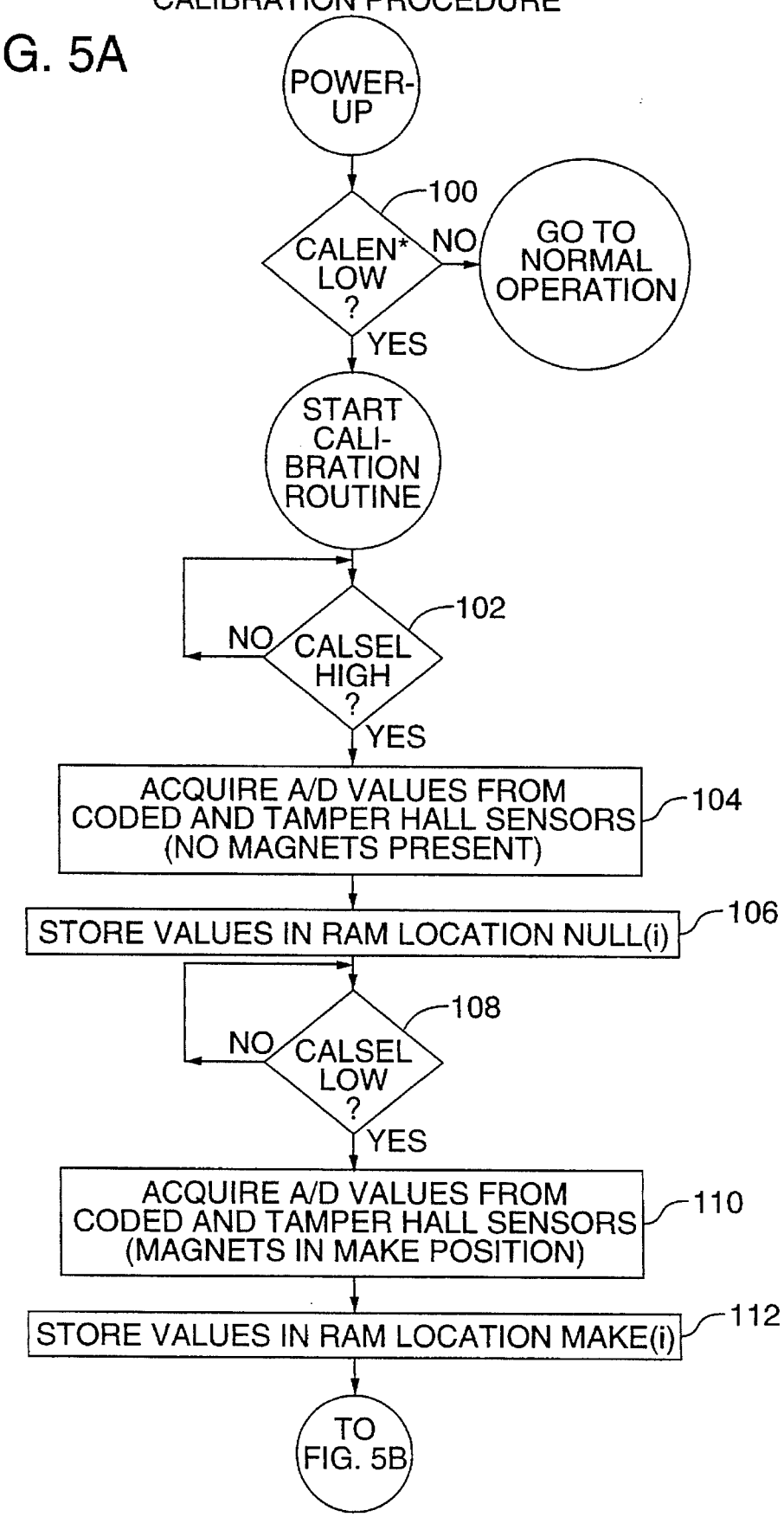

TIME MULTIPLEXED, FALSE ALARM RESISTANT MAGNETICALLY ACTUATED SECURITY SYSTEM

This is a continuation of application No. 08/105,588, filed Aug. 11, 1993 now abandoned.

TECHNICAL FIELD

The present invention relates to improvements in magnetically actuated devices for sensing an unauthorized breach of physical barriers as part of an electrically monitored physical security system and, in particular, to a substantially false alarm immune system that engages an alarm after a time dependent evaluation of selectively enabled magnetic sensors.

BACKGROUND OF THE INVENTION

Physical security monitoring systems are typically signaled by magnetically actuated switches that include magnetic field sensors mounted on a fixed member of a barrier and actuating magnets mounted on a moveable member of the barrier. The magnetic field sensors may be mounted, for example, on the fixed frame of a doorway, while the corresponding actuating magnets are mounted on the moveable door. When the barrier is secure, the actuating magnets induce a predetermined response at the sensor output from which the magnetic switch signals the monitoring system that the barrier is secure. When the barrier is breached, the actuating magnets are withdrawn from the proximity of the sensor, and the switch signals the monitoring system that the barrier has been penetrated.

Such magnetically actuated switches should be resistant to defeat by foreign magnetic fields. Prior systems have used multiple magnetic field sources of particular magnitude or polarity to elicit a "secure" status from an electric circuit. Such systems have made defeat more difficult, but not impracticable.

For example, U.S. Pat. No. 4,349,814 to Akehurst, describes a machine safety switch that is controlled with two Hall effect magnetic sensors arranged coplanarly and oriented so that each sensor responds to magnetic fields of opposite polarity. Such systems can be defeated however, by appropriate placement of a bar magnet of appropriate dimension close to the sensor plane.

Other prior systems arrange multiple magnets with multiple sensors to create unique magnetic "codings." The apparatus disclosed in U.S. Pat. No. 4,210,889 to Holce describes an arrangement of multiple magnetically responsive reed sensors biased to sense whether corresponding magnetic field sources of predetermined characteristics are either too close or too far from the sensors. Thus, a particular proximal arrangement between moveable and fixed members of a barrier elicits a "secure" signal from the Holce system while an alarm is generated when the moveable and fixed barrier members are situated either too close together or far apart. A later system, U.S. Pat. No. 4,806,910 to Salzer describes an arrangement of several magnets of different field strengths positioned on, or adjacent, a moveable member of a closure mechanism. The multiple field strengths, in combination, purportedly create a system in which a variety of defeat strategies can be detected. The use of multiple electronic sensors, as in Salzar, is limited however, by the extra current demanded by each sensor added to the system.

In addition to having immunity to alien magnetic fields, magnetically actuated switches should be false alarm resistant. Environmental effects, such as ubiquitous building vibration, generally cause irregular and transitory variations in the magnet-to-sensor distance that can initiate false alarms in magnetically switched security systems. The biasing of the reed sensors shown in U.S. Pat. No. 4,210,889 to Holce assists in mitigating such false alarm sensitivity. The biasing of the reed switches makes the switch less sensitive to small variations in magnet to sensor distance. However, some systems using multiple sensors, such as that shown in U.S. Pat. No. 4,806,910 to Salzer, may improve resistance to foreign magnet defeat but may concurrently display decreased immunity to false alarms because of heightened sensitivity to magnetic field changes.

Other prior systems have discriminated between false alarms and unauthorized entry by requiring that the magnet-to-sensor distance vary for more than a predetermined period of time. Such a prior art system is exemplified by U.S. Pat. No. 4,812,674 to Sue in which a fault condition must have a duration longer than the time constant of an RC circuit before an alarm will be triggered. Sue also uses multiple sensors to increase defeat resistance, but as in U.S. Pat. No. 4,806,910 to Salzer, increased sensors require increased current.

All of the previous systems also suffer from the disadvantage of requiring that an operator manually calibrate the cooperative action of the sensors and magnets, thus increasing the security risk for the eventual installation site.

SUMMARY OF THE INVENTION

An object of the present invention is, therefore, to reduce sensitivity to false alarms in magnetically actuated switches by selectively enabling and sampling the outputs of an array of magnetic sensors.

Another object of the invention is to reduce the power consumption of magnetically actuated switches using multiple sensors.

A further object of the invention is to increase the security of physical monitoring systems by automatically calibrating the invention to randomly generated magnet codings.

This invention is a magnetically actuated switch having reduced sensitivity to false alarms and is especially useful in applications using multiple sensors placed in a variety of locations or positioned along multiple axes. The invention includes a signal processing circuit controlled by a microprocessor that can select magnetic sensors individually, or in groups, and thereby reduce switch sensitivity to false alarms while reducing energy consumption. After selecting certain magnetic sensors or groups of sensors, the microprocessor compares the output or outputs from the selected sensor or sensors to automatically calibrated level or predetermined timing characteristics to determine whether an actuating magnetic field has changed in a manner indicative of a breach of the monitored barrier.

The method of this invention includes the steps of digitally selecting fewer than all available magnetic sensors at any one time, converting to digital form the analog outputs of selected sensors, and comparing the resultant output states of selected sensors to predetermined values to determine whether a fault or change in sensor output results from significant or minor changes in the security status of a monitored barrier. The method of selecting fewer than all available sensors at any one time reduces circuit sensitivity to false alarms while reducing circuit energy consumption.

In a preferred embodiment, a microprocessor uses a multiplexer to sequentially enable the outputs of separate magnetic field sensors. The output values of the enabled sensors are stored and compared to threshold levels stored in electrically erasable read only memory during a prior calibration and matching of the system to the physical characteristics of the installation site. If any one of the stored values is outside the threshold window, the system enters a pre-alarm status. If any one of the sensor values remains outside the threshold window during an arbitrary number of subsequent multiplex cycles through the sensor array, a valid alarm is registered. The interpretative software used by the microprocessor to evaluate sensor output signals has a hysteresis functionality that further mitigates inappropriate circuit responsiveness to transitory faults and assists the circuit in distinguishing significant faults from insignificant events.

The circuit also includes remote self-testing and tamper indication subcircuits. The remote self-testing subcircuit is digitally enabled and allows the switch system to be intentionally placed in alarm status to test the signaling capability of the switch system and associated respondent features of the monitoring installation. The tamper indication subcircuit precipitates an alarm signal when tampering is directed to the switch system circuitry.

The circuit of the invention has the capability to automatically calibrate itself to respond appropriately to random arrangements or codings of actuating magnets appended to a movable barrier member. A software module stored in read only memory can be actuated to transparently calibrate the system for the specific physical installation. To calibrate the circuit, the output values of the magnetic field sensors are measured and stored for three different positions of the actuating magnets. Because the circuit will begin an alarm verification if the barrier is either too close to the actuating magnets, the "High Security" position, thus making the system prone to false alarming, or if the barrier is too far from the actuating magnets, the "Make" position, indicating that the barrier has been penetrated, the sensor outputs are evaluated at the "High Security" and "Make" barrier positions and stored as part of the calibration routine. A third barrier position corresponding to the removal of the actuating magnets from the sensor field of the switch is also evaluated in the calibration procedure and is arbitrarily called "Open."

When the circuit is placed in normal monitor status, the sensor output values acquired during calibration are used by the microprocessor as thresholds against which sensor data are evaluated. Other than initiating calibration, the entire calibration process, including the generation of the random coding of the actuating magnets, is transparent to both manufacturing and installation personnel.

Additional objects and advantages of the present invention will be apparent from the following detailed description of preferred embodiments thereof, which proceeds with reference to the accompanying drawings.

BRIEF DESCRIPTION OF THE DRAWINGS

FIG. 1A is a block diagram of a magnetically actuated switch system of the present invention.

FIG. 1B shows three sensors arranged to detect three different directional aspects of a single proximal magnetic field established in the system shown in FIG. 1A.

FIG. 2 shows the flow diagram for the alarm verification subroutine used by the system depicted in FIG. 1A.

FIGS. 3A and 3B are a schematic diagram showing the electrical components of certain circuitry shown in the block depicted of FIG. 1A.

FIGS. 5A and 5B are a flow diagram of the calibration procedure implementation the system of FIGS. 1A, 3A and 3B.

DETAILED DESCRIPTION OF PREFERRED EMBODIMENTS

Figure 3A:
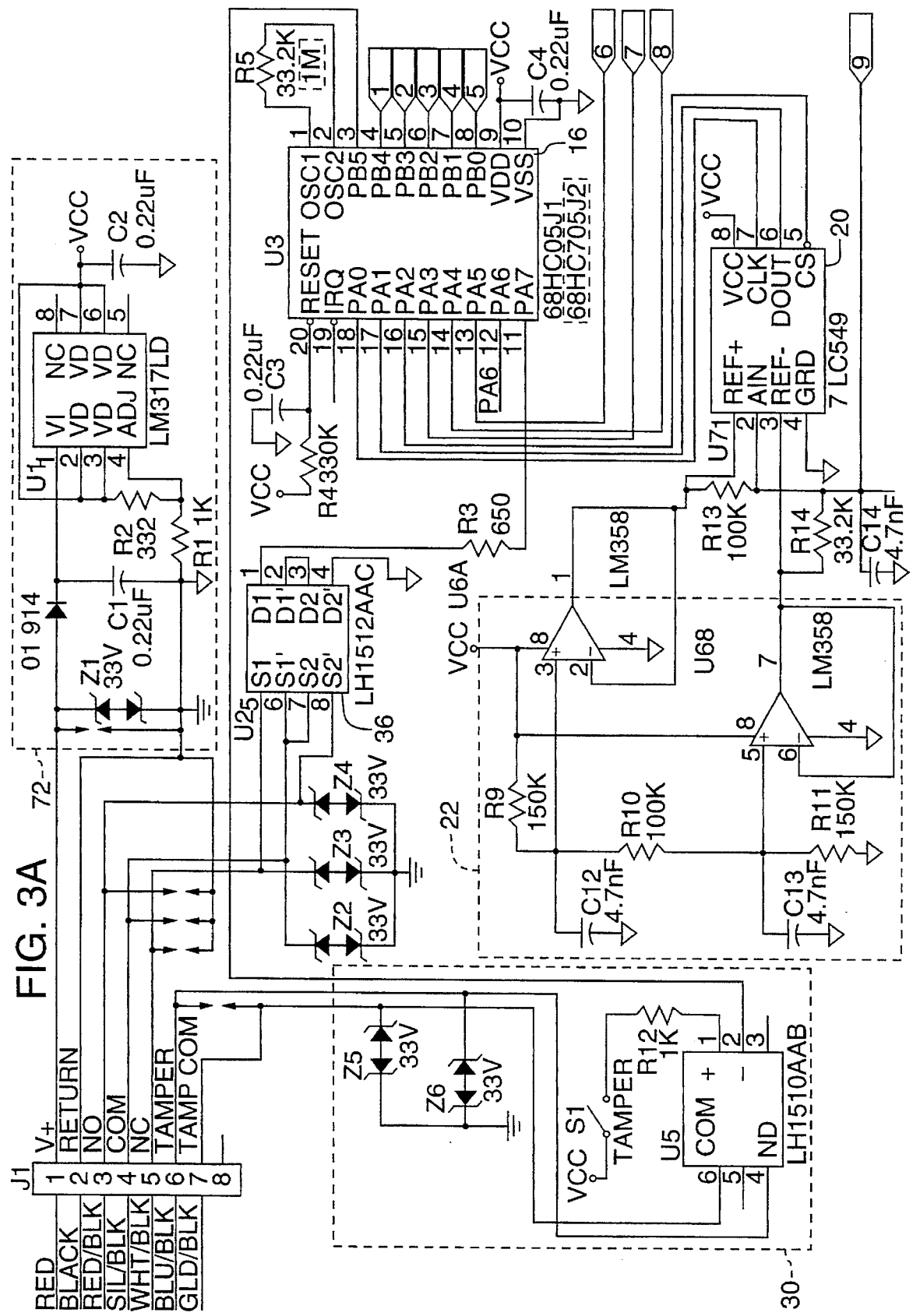

FIG. 1A is a block diagram of a preferred magnetically actuated switch system 10 designed in accordance with the present invention. System 10 processes information developed from the responses of magnetic sensors to a proximal magnetic field and signals a supplemental physical monitoring system of the corresponding secure or breached status of a barrier. In a preferred embodiment, system 10 is mounted, for example, on the fixed member of a barrier such as a door frame, while the actuating magnets are mounted on the moveable door. When the door is closed, the actuating magnets elicit a response from the magnetic sensors that system 10 interprets to indicate the barrier is secure; and when the door is opened beyond a selectable distance, the magnetic sensors respond to the change in the magnet-to-sensor distance by generating signals interpreted by system 10 as an indication the barrier has been breached.

System 10 has the capability to enable and evaluate the outputs from individual sensors in an array of magnetically responsive sensors. Therefore, system 10 can respond to particular timing-dependent changes in individual sensor outputs caused by changes in the relative position between fixed and moveable members of the monitored barrier. The following description is directed to the operation of system 10.

With reference to FIG. 1A, system 10 includes a set of individual magnetically actuated sensors 12 that respond to the proximal magnetic field of a coded magnet set 14. In a preferred embodiment, sensors 12 are Hall effect semiconductor devices that can transpose magnetic fields into electric fields that may be sensed by system 10 as electrical voltages from which information about the proximity of the actuating magnetic field may be gleaned. Coded magnet set 14 contains three actuating magnets 15A, 15B, and 15C arranged to present to sensors 12 a magnetic field having three magnetic locii. Sensors 12 are positioned on the fixed member of a barrier such as a door frame, while actuating coded magnet set 14 is positioned on the moveable barrier member or door. When the door is closed and the actuating magnets 15A, 15B, and 15C are near the magnetic sensors, the sensors produce output signals that system 10 interprets as a secure barrier condition, while when the door is opened beyond a selectable distance, the output from sensors 12 changes in a manner interpreted by system 10 as indicative of a barrier breach.

Sensors 12 are actuated one at a time, but in an alternative embodiment, different subsets of several ones of the set of sensors 12 may be enabled one subset at a time. To individually enable sensors 12, a microprocessor 16 signals a multiplexer 18 with the binary code corresponding to a particular selected individual magnetic sensor 12. Multiplexer 18 demultiplexes the supplied binary code and toggles one of its eight outputs. When the toggled output of multiplexer 18 changes state, corresponding sensor 12 is enabled and provides an analog output voltage corresponding to the magnetic flux density of the proximal magnetic field produced by coded magnet set 14. The toggled output of multiplexer 18 simultaneously enables a corresponding FET switch 19 that conditions and passes the output from the selected sensor 12 to the input of an analog-to-digital converter 20. Analog-to-digital converter 20 uses HIGH and LOW levels set by voltage reference 22 to resolve the analog output voltage of the selected sensor 12 into a serially transmitted 8-bit digital signal corresponding to a value between the HIGH and LOW levels. The 8-bit serial digital signal produced by analog-to-digital converter 20 is compared by microprocessor 16 to a threshold window established by two threshold levels previously stored in an EEROM 24 during a calibration procedure performed at the time of manufacture or at the system installation. If the output voltage of the selected sensor 12 falls outside the voltage range established by the threshold window, system 10 enters an alarm verification mode.

System 10 includes defenses against both physical pry tampering and magnetic tampering. A pry tamper subcircuit 30 includes a magnetically actuated reed sensor 32 that responds to a magnetic field produced by a pry-tamper magnet 34. Whenever system 10 is physically moved or removed from its installation, sensor 32 activates a tamper relay 36, that provides a signal to an external monitoring system to indicate physical tampering has occurred or is underway.

Two tamper sensors 38 oriented to detect stray magnetic fields monitor magnetic tampering. In a preferred embodiment, tamper sensors 38 are monitored in sequence with sensors 12. Microprocessor 16 determines whether the digital signal values derived from the analog voltages of output tamper sensors 38 exceed alarm threshold values stored in EEROM 24.

A self-test subcircuit 40 allows system 10 to be tested without opening the monitored barrier. When a switch in the separate monitoring system is closed, self-test subcircuit 40 signals microprocessor 16, which causes electrical current flow through an inductor 42 located proximal to one of sensors 12. The current flowing through inductor 42 creates a magnetic field that causes the output of proximal sensor 12 to be interpreted as varying beyond the threshold window stored in EEROM 24. Consequently, an alarm verification is initiated. Once an alarm is verified, an alarm loop relay 44 is closed and the separate monitoring system is signaled by system 10 that a verified breach of the barrier has occurred.

With reference to FIG. 1B, an alternative embodiment of system 10 includes a coded magnet set 14 that consists of a single rectangular magnet 45. Three magnetic sensors 12 are arranged to respond to different directional aspects (e.g., X-, Y-, and Z-axis directions) of the single magnetic field provided by magnet set 14.

The steps carried out in alarm verification for the embodiment illustrated in FIG. 1A are presented in the flow diagram of FIG. 2. Alarm verification invokes a software module that decrements a software register flag ALARMDELAY until it reaches zero, at which point an alarm condition is latched and signaled to the peripheral monitoring system.

With reference to FIG. 2, process block 60 indicates that microprocessor 16 initially sets an ALARMDELAY register to 7, which is one more than the total number of sensors 12 and 38. Process block 62 represents the sampling of individual output signals from each of sensors 12 and 38. Decision block 64 indicates a comparison of the acquired output signals with threshold values acquired in a prior calibration procedure. If the output signal of at least one of the sampled sensors 12 or 38, exceeds the prestored threshold values acquired during the prior calibration procedure, the ALARMDELAY register is decremented as represented in process block 66. Decision block 68 represents the comparison of the contents of the ALARMDELAY register with the value zero, and if the contents of ALARMDELAY register do not equal zero, the alarm verification process returns to process block 62 to sample again each of the sensors 12 and 38. If the alarm verification process has returned to sample the sensor outputs again and, as represented by decision block 64, none of the sensor outputs now exceeds the calibration threshold values, the alarm verification process returns to process block 60 where the ALARMDELAY register is set back to 7.

The process of alarm verification continues in this fashion until when, at decision block 68, the ALARMDELAY register equals zero. When the ALARMDELAY register equals zero, block 70 is executed, alarm status is latched, and the monitoring circuit is signaled. Therefore, because the ALARMDELAY register is decremented to zero from a value equal to the total number of sensors 12 and 38 plus one, before an alarm status is latched, a fault, consisting of one or more sensor outputs outside of the established thresholds, will have a duration at least equal to the length of time it takes system 10 to sample each of sensors 12 and 38 times the number of sensors plus one.

It will be appreciated that the initial value of the ALARMDELAY register is arbitrary, and that the sensitivity of system 10 may be modified by a variety of ways including varying the initial setting of a counting register such as the ALARMDELAY register. An alarm status exists in system 10 when microprocessor 16 closes alarm loop relay 36, which signals the peripheral monitoring system.

Figure 3B:
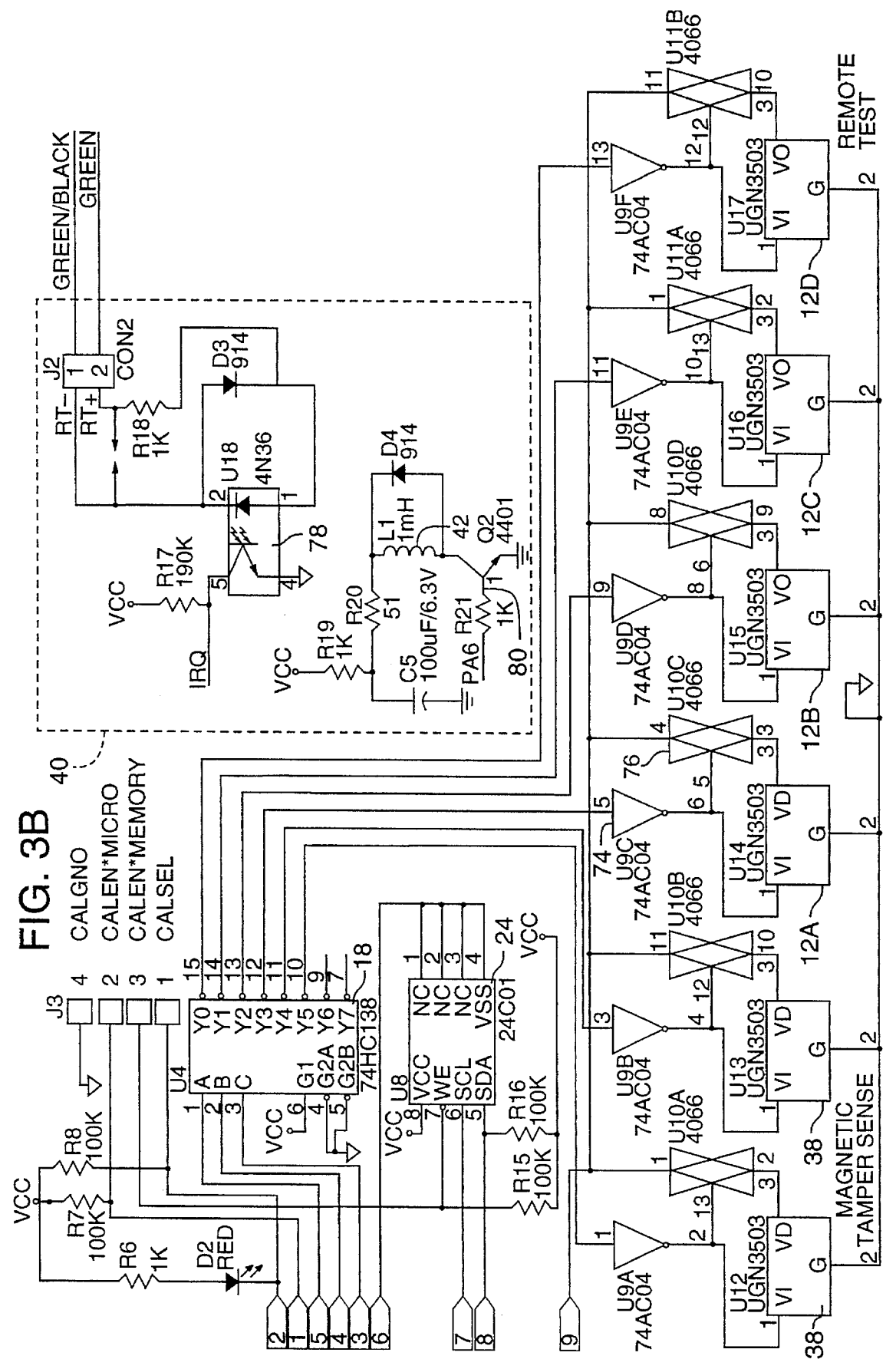

FIGS. 3A and 3B are a schematic electrical circuit diagram of a preferred embodiment of the system depicted in the block diagram of FIG. 1A. With reference to FIGS. 3A and 3B, microprocessor 16 is a microcontroller that controls system 10 by executing the software code stored in its on-board ROM. Any digital microprocessor may be used to control system 10, but a microcontroller is preferred for its on-board features, such as ROM and RAM.

Microprocessor 16 is preferably an eight-bit Motorola MC68HC05J1 microcontroller having 64 bytes of on-chip RAM and 1040 bytes of user ROM. The MC68HC05J1 can address 2048 bytes of memory input-output registers. Any port pin of the MC68HC05J1 can be configured either as an input or output by software control of the corresponding internal data direction register.

After power is applied to system 10 through a voltage conditioner 72, microprocessor 16 cycles 4064 times to allow its internal clock generator to stabilize. If its RESET input remains LOW after 4064 cycles, the MC68HC05J1 will continue to cycle without executing code until the RESET input goes high. As shown in FIGS. 3A and 3B, however, the RESET input is held HIGH by a 330K ohm resistor; therefore, microprocessor 16 begins execution of code after 4064 cycles.

The code executed by microprocessor 16 is stored in the 1040 bytes of on-board ROM. On reset, all ports of microprocessor 16 are configured as inputs. When logic HIGH states are written to appropriate bits of internal direction registers of microprocessor 16, corresponding ports are configured as outputs. Therefore, the first code executed writes logic HIGH states to selected bits of the internal data direction registers of microprocessor 16 to allow the MC68HC05J1 to interact with the rest of system 10. For example, pins PB0-PB2 are configured as outputs by setting the appropriate bits of the microprocessor internal data direction register to a logic HIGH. Outputs PB0-PB2 may then signal multiplexer 18 with the code corresponding to an individual sensor 12 or 38.

Multiplexer 18 is a Texas Instruments SN74HC138 3 line to 8 line decoder. Any multiplexer with the capacity to transpose binary code into an output allocating one bit for each sensor or subset of sensors that is to be discretely enabled may be used, but, in the preferred embodiment depicted in FIGS. 3A and 3B, the SN74HC138 was chosen for its low power consumption and compatibility with the rest of the logic devices on the board. Individual outputs Y0-Y7 of multiplexer 18 change state when an appropriate binary coded signal is applied to multiplexer 18 inputs A, B, C by microprocessor 16. The SN74HC138 places a logic LOW at the particular Y0-Y7 output corresponding to the selected sensor, while ENABLE input G1 is held HIGH and ENABLE inputs G2A and G2B are held LOW as shown in FIGS. 3A and 3B. For example, if sensor 12A is to be enabled, microprocessor 16 signals multiplexer 18 with the code 011 by applying logic LOW to INPUT C and logic HIGH to inputs A and B. Output Y3 of multiplexer 18 goes LOW in response, while the remaining outputs Y0-Y2 and Y4-Y7 remain HIGH. Thus, 011 at inputs C, B, A is decoded into 111011 for outputs Y0-Y5. This causes the Y3 output of multiplexer 18 to change state from HIGH to LOW and enables a corresponding inverting line driver 74 that enables sensor 12A. The remaining outputs Y6 and Y7 of multiplexer 18 remain unconnected because in this preferred embodiment there are six individual sensors and, therefore, there is a need for only six output lines from multiplexer 18. Other numbers of sensors may be used in system 10, and in such cases, multiplexer 18 should have at least one active output for each sensor or subset of sensors that is to be enabled at one time. The function table for the SN74HC138 is reproduced below.

TABLE I

FUNCTION TABLE

| ENABLE INPUTS | | | SELECT INPUTS | | | OUTPUTS | | | | | | | |
|---|---|---|---|---|---|---|---|---|---|---|---|---|---|
| G1 | G2A | G2B | C | B | A | Y0 | Y1 | Y2 | Y3 | Y4 | Y5 | Y6 | Y7 |
| X | H | X | X | X | X | H | H | H | H | H | H | H | H |
| X | X | H | X | X | X | H | H | H | H | H | H | H | H |
| L | X | X | X | X | X | H | H | H | H | H | H | H | H |
| H | L | L | L | L | L | L | H | H | H | H | H | H | H |
| H | L | L | L | L | H | H | L | H | H | H | H | H | H |
| H | L | L | L | H | L | H | H | L | H | H | H | H | H |
| H | L | L | L | H | H | H | H | H | L | H | H | H | H |
| H | L | L | H | L | L | H | H | H | H | L | H | H | H |
| H | L | L | H | L | H | H | H | H | H | H | L | H | H |
| H | L | L | H | H | L | H | H | H | H | H | H | L | H |
| H | L | L | H | H | H | H | H | H | H | H | H | H | L |

With continuing reference to the example of the prior paragraph, output Y3 of multiplexer 18 is LOW while Y0-Y2 and Y4-Y7 are HIGH. The outputs of multiplexer 18 are connected to inverting line drivers 74 having outputs logically inverted from their corresponding inputs. Therefore, the LOW on output Y3 of multiplexer 18 causes a HIGH output on the corresponding output of selected line driver 74. SN74AC04 line drivers are chosen for the embodiment of FIGS. 3A and 3B because of their ability to supply approximately 30 mA of output current at 5 V in response to an input logic LOW. Therefore, when Y3 of multiplexer 18 is LOW, the output of corresponding inverting line driver 74 is a logic HIGH driven at up to 30 mA. The outputs of line drivers 74 are connected to the supply pins of corresponding individual sensors 12 or 38. Thus, when multiplexer 18 output Y3 goes LOW, the output of selected line driver 74 goes HIGH, and sensor 12A is enabled.

Ratiometric, linear, UGN3503 Hall effect sensors are chosen for sensors 12 and 38 in the preferred embodiment of FIGS. 3A and 3B because of their linearity over temperature and low current demands. Linearity over temperature eliminates the need for repetitive calibration to compensate for temperature variations. The UGN3503 sensor typically requires about 9 mA supply current with a current demand maximum of about 14 mA. Consequently, the SN74AC04 line drivers 50 can generate sufficient supply current to readily power the UGN3503 sensors 12 and 38. The quiescent output voltage of the UGN3503 is typically 2.5 V but ranges from between 2.25 and 2.75 volts. Sensitivity of the UGN3503 is typically 1.30 mV per Gauss at 5 V supply potential, but can range from between 0.75 to 1.72 mV per Gauss in response to variations in supply voltage. The output voltage from each sensor 12 and 38 responds to levels of magnetic field up to 900 Gauss.

The output of each line driver 74 is connected to a corresponding bilateral analog FET switch 76 in addition to a particular magnetic sensor 12 or 38. When enabled, the selected bilateral FET switch 76 conditions and passes the analog output from corresponding enabled sensor 12 or 38 to analog-to-digital converter 20. Bilateral FET switches 76 appear as high impedance loads when open. As depicted in FIGS. 3A and 3B, a resistor network following voltage reference 22 holds the AIN input within the range of between the HIGH and LOW logic state voltages supplied by voltage reference 22 when all bilateral FET switches 76 are open. When a bilateral FET switch 76 is enabled by the HIGH output from an enabled line driver 76, the AIN input is taken to the voltage produced by the simultaneously enabled sensor 12 or 38 in response to the proximal magnetic field supplied by coded magnet set 18 or, in the case of tamper sensors 38, a stray magnetic field.

Analog-to-digital converter 20 is a Texas Instruments TLC549 CMOS 8-bit serial control analog-to-digital converter with a conversion time of 36 internal clock cycles or 17 microseconds maximum. When the AIN input is greater than REF+, the output stream is 11111111 (i.e., all logic HIGH states), and when the input is less than REF-, the output stream is 00000000 (i.e., all logic LOW states). REF+ is fixed at the HIGH state, which is an approximately 3.125 volt output of voltage reference 22; and REF- is fixed at the LOW state, which is an approximately 1.875 volt output of voltage reference 22.

System 10 includes self-test subcircuit 40 to allow testing of both system 10 and any respondent features of appended peripheral monitoring systems without affecting the secure status of the monitored barrier. To implement self-test subcircuit 40, a peripheral monitoring system drives an appropriate current through the light-emitting diode component of an opto-coupler 78, which brings the microprocessor input pin $\overline{\text{IRQ}}$ LOW as the transistor component of opto-coupler 78 conducts in response to the emitted light. When $\overline{\text{IRQ}}$ goes LOW, microprocessor 16 pushes the register contents off to the microprocessor internal stack, sets the interrupt mask, and loads the program counter with the appropriate vector location. Microprocessor 16 then begins executing the self-test code that causes output PA6 to go HIGH, making transistor 80 conductive in response. Consequently, electric current flows through inductor 42, inducing a magnetic field about inductor 42 that causes proximal and simultaneously enabled sensor 12D to produce an output signal that is interpreted by microprocessor 16 as being beyond the pre-stored threshold limits stored in EEROM 24. This condition puts system 10 into alarm status.

Figure 4:
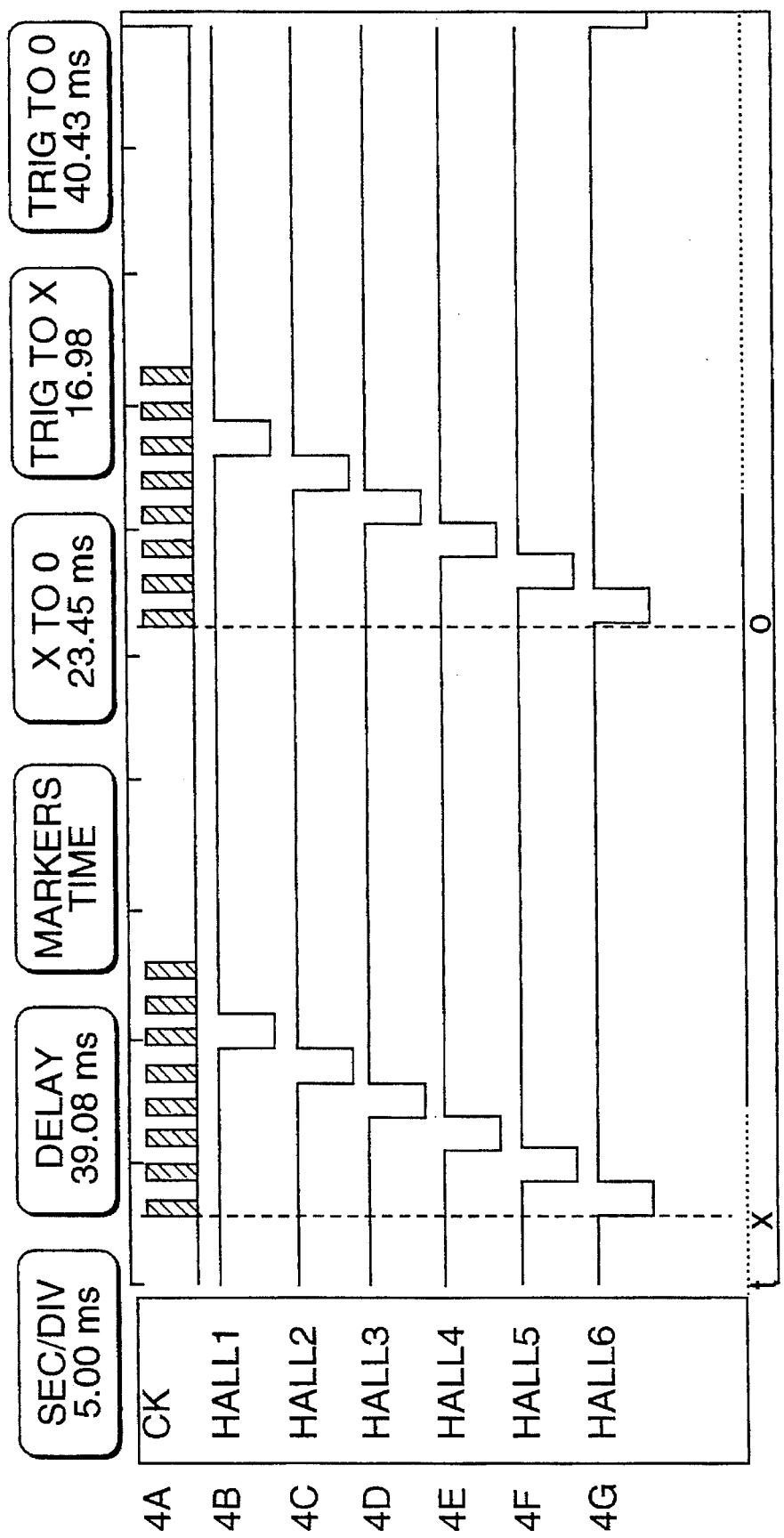
FIG. 4 is a timing diagram showing the sequential sensor sampling of the embodiment depicted in FIGS. 1A, 3A and 3B.

FIG. 4 shows the timing relationship among the six outputs of multiplexer 18 as sensors 12 and 38 are individually enabled in the preferred embodiment of FIGS. 3A and 3B. The system clock "CK" shown in FIG. 4A has frequency of approximately 750 KHz. Starting with output Y0 of multiplexer 18, individual outputs of multiplexer 18 are brought LOW at the rising edge of CK. A LOW on a multiplexer output Y(i) elicits a HIGH output from the selected line driver 74 that enables selected sensor 12 or 38 and corresponding bilateral FET switch 76. As FIG. 4 illustrates, the preferred embodiment of FIGS. 3A and 3B completes a sampling of all six magnetic sensors 12 and 38 in about 23.45 ms. As the alarm verification routine of FIG. 2 depicts, system 10 cycles through the set of sensors 12 and 38 a number of times equal to the number of sensors plus one before an alarm is verified. A fault must persist, therefore, for at least approximately 164.15 ms (23.45×(6+1)).

System 10 also uses interpretive software having a hysteresis functionality to mitigate any potential for circuit responsiveness to insignificant faults. The sensor output voltage must change by a determinable amount before the switch will go into alarm. The required change in voltage is expressed as a certain number of counts analog-to-digital converter 20 output must change before an alarm will be generated. Those skilled in the art will recognize that a variety of signal sampling and interpretation schemes may be implemented using the present invention and that not only timing, but sequence, as well as circuit interpretative response to sensor output variations may be combined to achieve a variety of sensitivities to various fault conditions.

System 10 automatically and transparently sets the threshold windows that will be used as standards by microprocessor 16 to determine whether outputs from sensors 12 or 38 are indicative of breach of the monitored barrier or attempts to deceive system 10 with foreign magnetic fields. Therefore, characteristics such as field density and polarity of the magnets comprising magnet set 14 may be randomly generated during manufacturing and system 10 adapted to the resulting unique codings during site installation.

Figure 5B:
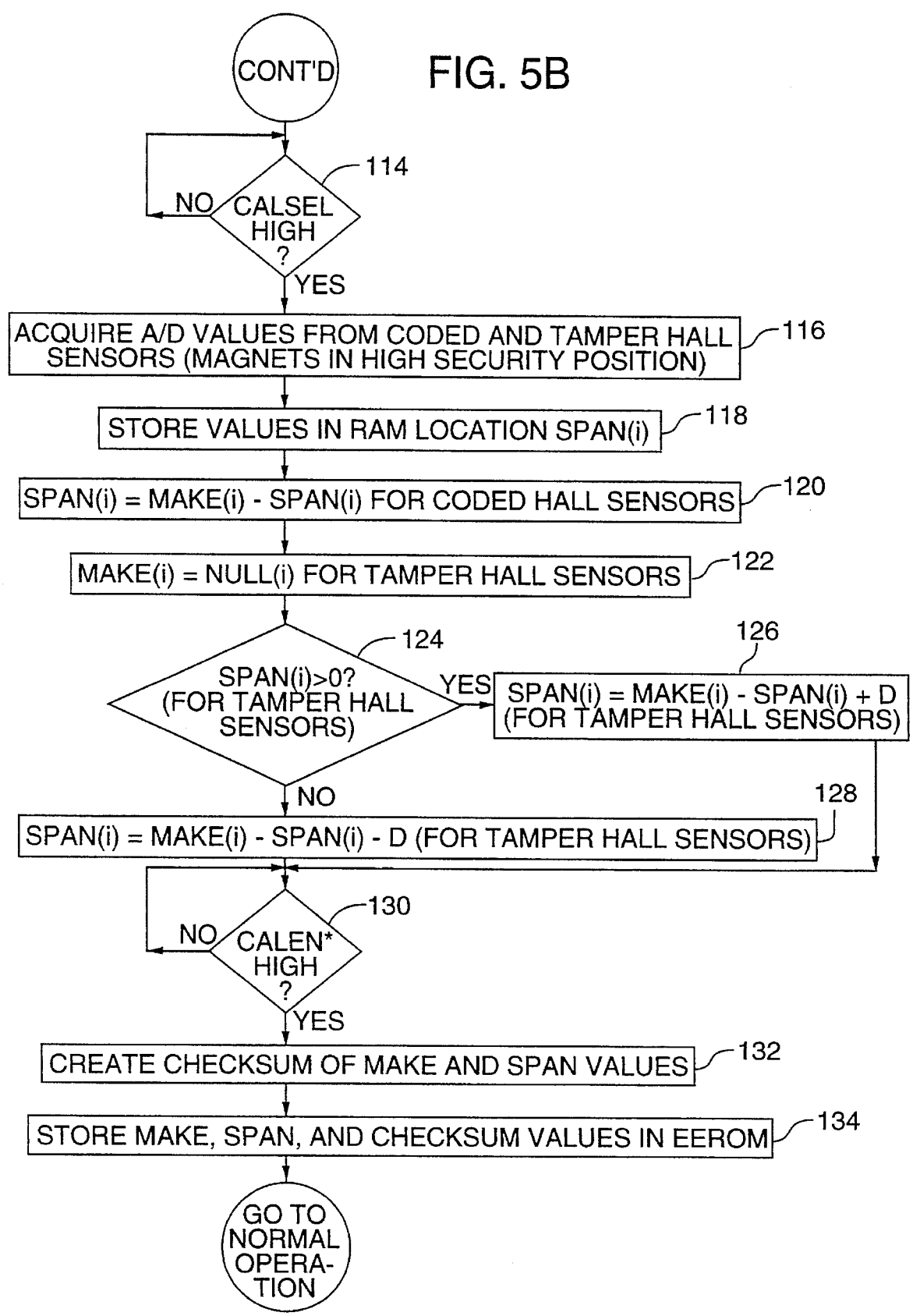

FIGS. 5A and 5B depict the decisional flow pattern taken by system 10 during the calibration procedure. With reference to FIGS. 5A and 5B, after power is applied to system 10, decision block 100 indicates that at power up, microprocessor 16 samples the state of CALEN* and directs system 10 into calibration if CALEN, is LOW and normal monitor operation if CALEN, is HIGH. If CALEN* is LOW, pin 7 of EEROM 24 is brought LOW and EEROM 24 is write enabled to begin the calibration routine. If CALEN* is held HIGH, system 10 proceeds to normal monitor mode.

Decision block 102 indicates that microprocessor 16 repetitively loops until CALSEL is brought HIGH by operator selection. Prior to operator selection of CALSEL HIGH, the moveable barrier member to which the actuating magnet set 14 is attached is opened by the operator to a position that will place magnet set 14 as far as possible from sensors 12 and 38. Then CALSEL is brought HIGH by operator selection. Process block 104 indicates that microprocessor 16 acquires digitally converted output values from both coded and tamper magnet responsive sensors 12 and 38 after magnet set 14 has been distanced from sensors 12 and 38 and CALSEL has been brought HIGH. The acquired values are stored in on-board RAM locations NULL1 through NULL6 as depicted in process block 106.

Decision block 108 indicates that microprocessor 16 repetitively loops waiting for CALSEL to go LOW. Before CALSEL is brought LOW by operator selection, the moveable barrier member to which magnet set 14 is attached is moved by the operator to the "Make" position beyond which the barrier should not, during normal operation, be allowed to open without an alarm fault being signaled by system 10. Process block 110 indicates that microprocessor 16 then acquires the resulting digitally converted output values from coded and tamper magnetic sensors 12 and 38 and in process block 112, those values are stored in RAM locations MAKE1 to MAKE6.

In decision block 114, microprocessor 16 loops until CALSEL goes HIGH by operator selection. In order to reduce false alarms, the system will sound an alarm if the moveable barrier is set too close to the fixed barrier member. Therefore, before CALSEL is brought HIGH as in decision block 114, the barrier with mounted magnet set 14 is placed in the "High Security" position marking the closest permissible point between magnets and sensors 12 and 38. Process block 116 indicates that microprocessor 16 acquires the resulting output values from sensors 12 and 38 when the magnets and sensors are in positions corresponding to the "High Security" position of the monitored barrier. The acquired values are stored in RAM locations SPAN1 to SPAN6 in process block 118. Process block 120 entails the replacement of RAM locations SPAN1 through SPAN4 corresponding to the four sensors 12 that respond to coded magnet set 14, with the result from SPAN(i)=MAKE(i)-SPAN(i) for each (i) from 1 to 4. In process block 122, RAM locations MAKE5 and MAKE6 corresponding to values from tamper sensors 13 are replaced with values NULL5 and NULL6.

In decision block 124, if SPAN(i) for i=1 to 4 (sensors 12 responsive to coded magnet set 14) is greater than zero, SPAN(i) is replaced according to the formula: SPAN(i)= MAKE(i)–SPAN(i)+D. D is an offset value. If SPAN(i) for i=1 to 4 is less than or equal to zero, then SPAN(i) is replaced as indicated in the formula: SPAN(i)=MAKE(i)–SPAN(i)–D.

In decision block 130, microprocessor 16 loops until CALEN, is brought HIGH by operator selection. When CALEN, goes HIGH, a checksum of MAKE and SPAN values is created as indicated in process block 132; and MAKE(i), SPAN(i), and checksum values are stored in EEROM 24 in process block 134 after which, system 10 returns to normal monitor mode.

It will be obvious to those having skill in the art that many changes may be made in the above-described details of the preferred embodiments of the present invention. The scope of the present invention should, therefore, be determined only by the following claims.

We claim:

1. A system for detecting a relative placement of moveable and fixed members of a barrier outside of a spatial window defined by minimum and maximum allowable distances between the moveable and fixed members, comprising:

a magnetic field source to provide a multi-directional proximal magnetic field;

multiple determinably selectable magnetic field sensors producing output signals responsive to the proximal magnetic field; and a sensor output signal responsive electrical circuit capable of selecting fewer than all of the determinably selectable sensors at a time and adaptable to selectively establish first and second retainable sensor output signal levels corresponding to the respective minimum and maximum allowable distances between the moveable and fixed members that define the spatial window outside of which relative placement of the moveable and fixed barrier members enables the sensor output signal responsive electrical circuit to notify a monitoring system.

2. The system of claim 1 in which the electrical circuit includes a multiplexer for selecting fewer than all of the determinably selectable sensors at a time.

3. The system of claim 1 in which the magnetic field sensors are of a Hall effect type.

4. The system of claim 1 in which the magnetic field source includes randomly positioned multiple magnetic sources.

5. The system of claim 1 in which each of the sensors is arranged to respond to a different directional aspect of the multi-directional proximal magnetic field.

6. The system of claim 5 in which there are three magnetic field sensors and each of which is arranged to produce an output signal responsive to a separate direction of the multi-directional proximal magnetic field.

7. An apparatus for detecting a change in relative position between moveable and fixed members of a barrier in a physical security system comprising:
a magnetic field sensor producing an output signal responsive to a proximal magnetic field;
a magnetic field source to provide the proximal magnetic field; and
a sensor output electrical circuit for signaling a monitoring system, the sensor output electrical circuit including a digitally initiated magnetic field source that simulates the effect of a change in relative position between the moveable and fixed members on the output signal sufficient to initiate signaling of the monitoring System, thereby to allow the sensor output electrical circuit to be tested without a change in relative position between the moveable and fixed members of the barrier.

8. The apparatus of claim 7 in which the digitally initiated magnetic field source comprises an inductor.

9. A method of providing a magnetic field-based security system implemented to have an operator transparent, randomly generated magnetic code for detecting a relative placement of a movable member and a fixed member of a barrier, comprising:
operatively connecting a randomly coded magnetic field source to one of the movable and fixed members, the randomly coded magnetic field source producing a magnetic field characterized by a magnetic field density pattern;
operatively connecting a set of multiple magnetic field sensors to the other one of the movable and fixed members, each of the sensors producing a signal responsive to the magnetic field density pattern; and
calibrating the security system by:
setting the movable and fixed members at first and second relative positions that correspond to respective first and second distances between the randomly coded magnetic field source and the set of multiple magnetic field sensors,
acquiring at each of the first and second positions information corresponding to the signal produced by each of the magnetic field sensors,
determining from the acquired information in accordance with an operator-transparent computational procedure threshold level distances between the randomly coded magnetic field source and the set of magnetic field sensors that define an alarm condition so that the nature of the interaction between the random code characterizing the magnetic field source and the set of sensors remains unrevealed to an operator carrying out the method, and
storing in memory the threshold level differences for later comparison with an actual distance between the randomly coded magnetic field source and the set of sensors when the system is in use.

10. The method of claim 9 in which the first distance represents between the magnetic field sensors and the randomly coded magnetic field source a distance longer than that which would cause an alarm condition and in which the second distance represents between the magnetic field sensors and the randomly coded magnetic field source a distance shorter than that which would cause an alarm condition.

11. The method of claim 9 in which the security system comprises computer circuitry including a memory and in which the computational procedure is implemented in a software routine stored in the memory.

12. The method of claim 9 in which the magnetic field sensors are of a Hall effect type.

13. The method of claim 9 in which the security system comprises a multiplexer that is operatively associated with the set of multiple magnetic field sensors to selectively enable at any one time fewer than all of the magnetic field sensors in the set and thereby reduce system energy consumption.

14. The method of claim 9 in which the randomly coded magnetic field source provides a multi-directional magnetic field density pattern and the magnetic field sensors are configured to provide signals in response to different directional aspects of the magnetic field density pattern.

15. The method of claim 14 in which the randomly coded magnetic field source comprises a coded magnet set.

16. The method of claim 15 in which the coded magnet set comprises a single magnet.

* * * * *